(12) United States Patent
Yamashita et al.

(10) Patent No.: US 8,836,833 B2
(45) Date of Patent: Sep. 16, 2014

(54) SOLID-STATE IMAGING APPARATUS HAVING PIXELS WITH PLURAL SEMICONDUCTOR REGIONS

(75) Inventors: Yuichiro Yamashita, Ebina (JP); Yasuo Yamazaki, Sagamihara (JP); Masaru Fujimura, Yokohama (JP); Shin Kikuchi, Isehara (JP); Shoji Kono, Hachioji (JP); Shinichiro Shimizu, Yokohama (JP); Yu Arishima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 163 days.

(21) Appl. No.: 13/159,510

(22) Filed: Jun. 14, 2011

(65) Prior Publication Data
US 2012/0008031 A1    Jan. 12, 2012

(30) Foreign Application Priority Data
Jul. 7, 2010   (JP) ................................. 2010-155261

(51) Int. Cl.
| | | |
|---|---|---|
| H04N 3/14 | (2006.01) | |
| H04N 5/335 | (2011.01) | |
| H04N 5/32 | (2006.01) | |
| H04N 5/357 | (2011.01) | |
| H04N 5/3745 | (2011.01) | |
| H01L 27/146 | (2006.01) | |

(52) U.S. Cl.
CPC ..... *H01L 27/14609* (2013.01); *H01L 27/14663* (2013.01); *H01L 27/14643* (2013.01); *H04N 5/32* (2013.01); *H04N 5/3575* (2013.01); *H04N 5/3745* (2013.01)
USPC ............ 348/301; 348/294; 348/300; 348/308

(58) Field of Classification Search
CPC ................... H01L 27/14643; H01L 27/14609; H01L 27/14603; H01L 27/14689; H04N 5/374; H04N 5/335; H04N 5/378; H04N 5/3745; H04N 3/14

USPC .................................................. 348/294–310
See application file for complete search history.

(56) References Cited

U.S. PATENT DOCUMENTS

| | | |
|---|---|---|
| 3,364,822 A | 1/1968 | Gutkowski |
| 4,386,327 A | 5/1983 | Ogawa |

(Continued)

FOREIGN PATENT DOCUMENTS

| | | |
|---|---|---|
| CN | 1604655 A | 4/2005 |
| CN | 1697493 A | 11/2005 |

(Continued)

OTHER PUBLICATIONS

Pending Unpublished U.S. Appl. No. 13/945,580; Inventor: Yu Arishima, et al.; Filing Date: Jul. 18, 2013.

*Primary Examiner* — Chia-Wei A Chen
(74) *Attorney, Agent, or Firm* — Fitzpatrick, Cella, Harper & Scinto

(57) ABSTRACT

A solid-state imaging apparatus has a pixel array in which a plurality of pixels are arranged to form a plurality of rows and a plurality of columns, and a plurality of column signal lines are arranged, wherein each of the plurality of pixels includes a photoelectric converter including a first well formed in a semiconductor substrate and having a first conductivity type, and an impurity region arranged in the first well and having a second conductivity type different from the first conductivity type, and an in-pixel readout circuit which outputs, to the column signal line, a signal corresponding to charges generated in the photoelectric converter, the in-pixel readout circuit including a circuit element arranged in a second well having the first conductivity type, and wherein the first well and the second well are isolated by a semiconductor region having the second conductivity type.

8 Claims, 9 Drawing Sheets

(56) References Cited

U.S. PATENT DOCUMENTS

| | | | |
|---|---|---|---|
| 4,954,895 A * | 9/1990 | Akimoto et al. | 348/301 |
| 5,120,199 A | 6/1992 | Youngs et al. | |
| 5,245,203 A | 9/1993 | Morishita et al. | |
| 5,352,920 A | 10/1994 | Morishita et al. | |
| 5,506,430 A | 4/1996 | Ohzu | 257/292 |
| 6,057,586 A | 5/2000 | Bawolck et al. | 257/435 |
| 6,211,509 B1 | 4/2001 | Unoue et al. | |
| 6,239,839 B1 * | 5/2001 | Matsunaga et al. | 348/308 |
| 6,590,242 B1 | 7/2003 | Kozuka et al. | |
| 6,649,951 B2 | 11/2003 | Kozuka et al. | |
| 6,780,666 B1 * | 8/2004 | McClure | 438/57 |
| 6,878,977 B1 | 4/2005 | Kozuka et al. | |
| 6,900,480 B2 | 5/2005 | Sugiyama | 257/222 |
| 6,906,793 B2 * | 6/2005 | Bamji et al. | 356/141.1 |
| 6,960,751 B2 | 11/2005 | Hiyama et al. | |
| 6,965,135 B2 | 11/2005 | Sugiyama | 257/222 |
| 6,969,877 B2 | 11/2005 | Sugiyama | 257/222 |
| 6,974,980 B2 | 12/2005 | Sugiyama | 257/222 |
| 7,016,089 B2 | 3/2006 | Yoneda et al. | |
| 7,106,843 B1 | 9/2006 | Gainsboro et al. | |
| 7,151,305 B2 | 12/2006 | Kozuka et al. | |
| 7,235,831 B2 | 6/2007 | Kozuka et al. | |
| 7,256,382 B2 | 8/2007 | Yahazu et al. | 250/208.1 |
| 7,288,428 B2 | 10/2007 | Muramatsu | |
| 7,321,110 B2 | 1/2008 | Okita et al. | |
| 7,348,615 B2 | 3/2008 | Koizumi | |
| 7,408,210 B2 | 8/2008 | Ogura et al. | |
| 7,427,789 B2 | 9/2008 | Muramatsu | |
| 7,429,764 B2 | 9/2008 | Koizumi et al. | |
| 7,456,888 B2 | 11/2008 | Kikuchi | |
| 7,460,162 B2 | 12/2008 | Koizumi et al. | |
| 7,470,893 B2 | 12/2008 | Suzuki et al. | |
| 7,547,871 B2 | 6/2009 | Hiyama et al. | |
| 7,550,793 B2 | 6/2009 | Itano et al. | |
| 7,554,591 B2 | 6/2009 | Kikuchi et al. | |
| 7,557,846 B2 | 7/2009 | Ohkawa | |
| 7,557,847 B2 | 7/2009 | Okita et al. | |
| 7,623,056 B2 | 11/2009 | Yamashita | |
| 7,633,539 B2 | 12/2009 | Yamashita | 348/294 |
| 7,679,658 B2 | 3/2010 | Sakurai et al. | |
| 7,755,688 B2 | 7/2010 | Hatano et al. | |
| 7,808,537 B2 | 10/2010 | Fujimura et al. | 348/300 |
| 7,817,199 B2 | 10/2010 | Yamashita et al. | 348/308 |
| 7,852,393 B2 | 12/2010 | Kikuchi et al. | 348/308 |
| 7,859,587 B2 | 12/2010 | Katsuno et al. | 348/340 |
| 7,907,196 B2 | 3/2011 | Ogura et al. | |
| 7,916,195 B2 | 3/2011 | Kudoh | 348/294 |
| 7,928,477 B2 | 4/2011 | Kobayashi et al. | |
| 7,948,540 B2 | 5/2011 | Ogura et al. | |
| 7,961,237 B2 | 6/2011 | Hatano et al. | 348/300 |
| 8,253,214 B2 | 8/2012 | Guidash et al. | |
| 8,269,872 B2 | 9/2012 | Okumura | 348/308 |
| 8,279,313 B2 | 10/2012 | Rhodes | 348/308 |
| 8,293,565 B2 | 10/2012 | Ootake | 438/73 |
| 8,330,195 B2 * | 12/2012 | Venezia et al. | 257/294 |
| 8,411,157 B2 | 4/2013 | Gomi et al. | 348/220.1 |
| 8,462,252 B2 | 6/2013 | Wada | 348/312 |
| 8,508,642 B2 | 8/2013 | Tanaka | 348/308 |
| 8,525,906 B2 | 9/2013 | Ui | 348/294 |
| 8,569,805 B2 * | 10/2013 | Sugawa et al. | 257/225 |
| 8,670,056 B2 | 3/2014 | Kono et al. | |
| 2001/0013901 A1 * | 8/2001 | Matsunaga et al. | 348/308 |
| 2002/0050940 A1 | 5/2002 | Sato et al. | 341/155 |
| 2002/0149688 A9 * | 10/2002 | Matsunaga et al. | 348/308 |
| 2002/0163583 A1 | 11/2002 | Jones | 348/272 |
| 2003/0160887 A1 | 8/2003 | Takahashi | 348/350 |
| 2003/0164887 A1 * | 9/2003 | Koizumi et al. | 348/308 |
| 2003/0169360 A1 * | 9/2003 | Rhodes | 348/308 |
| 2004/0130757 A1 * | 7/2004 | Mabuchi | 358/482 |
| 2004/0169751 A1 | 9/2004 | Takemura et al. | 348/294 |
| 2005/0018065 A1 | 1/2005 | Tashiro et al. | 348/308 |
| 2005/0032281 A1 * | 2/2005 | McClure | 438/144 |
| 2005/0127415 A1 * | 6/2005 | Yuzurihara et al. | 257/292 |
| 2005/0179796 A1 | 8/2005 | Okita et al. | |
| 2005/0231656 A1 | 10/2005 | Den Boer et al. | 349/42 |
| 2005/0253945 A1 | 11/2005 | Shinohara | 348/300 |
| 2006/0082669 A1 * | 4/2006 | Inoue et al. | 348/308 |
| 2006/0187329 A1 | 8/2006 | Panicacci | 348/308 |
| 2007/0025354 A1 | 2/2007 | Pettey et al. | 370/392 |
| 2007/0070274 A1 | 3/2007 | Yu et al. | 349/114 |
| 2007/0109437 A1 * | 5/2007 | Funaki et al. | 348/308 |
| 2007/0205354 A1 * | 9/2007 | Li | 250/208.1 |
| 2007/0258000 A1 | 11/2007 | Kondo | 348/308 |
| 2007/0290143 A1 | 12/2007 | Kameshima et al. | 250/370.09 |
| 2008/0068480 A1 | 3/2008 | Okita et al. | 348/294 |
| 2008/0170143 A1 | 7/2008 | Yoshida | |
| 2008/0273093 A1 | 11/2008 | Okita et al. | |
| 2008/0283884 A1 * | 11/2008 | Park | 257/292 |
| 2009/0027529 A1 | 1/2009 | Jung et al. | 348/294 |
| 2009/0085135 A1 | 4/2009 | Bang | 257/432 |
| 2009/0134433 A1 | 5/2009 | Jung | 257/239 |
| 2009/0160983 A1 | 6/2009 | Lenchenkov | 348/294 |
| 2009/0174799 A1 | 7/2009 | Lee et al. | 348/294 |
| 2009/0201400 A1 * | 8/2009 | Zhang et al. | 348/296 |
| 2009/0201406 A1 | 8/2009 | Okita et al. | |
| 2009/0218479 A1 | 9/2009 | Arishima et al. | |
| 2009/0244328 A1 | 10/2009 | Yamashita | 348/241 |
| 2009/0251578 A1 | 10/2009 | Yamashita | 348/302 |
| 2009/0284632 A1 * | 11/2009 | Onuki et al. | 348/302 |
| 2009/0303364 A1 | 12/2009 | Shibata et al. | 348/302 |
| 2010/0002114 A1 | 1/2010 | Ogura et al. | 348/301 |
| 2010/0053398 A1 | 3/2010 | Yamashita | |
| 2010/0066877 A1 | 3/2010 | Yamaguchi et al. | 348/279 |
| 2010/0078692 A1 | 4/2010 | Lim | 257/292 |
| 2010/0079635 A1 | 4/2010 | Yano et al. | 348/294 |
| 2010/0079636 A1 | 4/2010 | Aoki et al. | 348/294 |
| 2010/0084728 A1 | 4/2010 | Yamada | 257/432 |
| 2010/0148289 A1 * | 6/2010 | McCarten et al. | 257/432 |
| 2010/0149366 A1 | 6/2010 | Noda et al. | 348/222.1 |
| 2010/0165159 A1 * | 7/2010 | Kumesawa | 348/294 |
| 2010/0165167 A1 | 7/2010 | Sugiyama et al. | |
| 2010/0182465 A1 * | 7/2010 | Okita | 348/273 |
| 2010/0198482 A1 | 8/2010 | Hartmann et al. | 701/103 |
| 2010/0200738 A1 | 8/2010 | Yamashita | |
| 2010/0201834 A1 | 8/2010 | Maruyama et al. | 348/222.1 |
| 2010/0225776 A1 | 9/2010 | Taura | 348/222.1 |
| 2010/0225793 A1 | 9/2010 | Matsuda et al. | |
| 2010/0231767 A1 | 9/2010 | Kikuchi | |
| 2010/0259658 A1 | 10/2010 | Konishi | 348/294 |
| 2010/0271517 A1 | 10/2010 | De Wit et al. | 348/294 |
| 2010/0291729 A1 | 11/2010 | Kawano | |
| 2010/0309357 A1 | 12/2010 | Oike | 348/302 |
| 2010/0327148 A1 | 12/2010 | Chung et al. | 250/208.1 |
| 2010/0328302 A1 | 12/2010 | Yamashita et al. | |
| 2010/0328509 A1 | 12/2010 | Yamashita et al. | |
| 2010/0328510 A1 * | 12/2010 | Hiyama et al. | 348/300 |
| 2011/0001861 A1 | 1/2011 | Tanaka et al. | 348/300 |
| 2011/0007173 A1 * | 1/2011 | Takenaka et al. | 348/222.1 |
| 2011/0007196 A1 | 1/2011 | Yamashita et al. | 348/294 |
| 2011/0013062 A1 | 1/2011 | Yamashita | |
| 2011/0025892 A1 | 2/2011 | Hibbeler et al. | 348/294 |
| 2011/0025896 A1 | 2/2011 | Yamashita et al. | 348/294 |
| 2011/0032379 A1 | 2/2011 | Kobayashi et al. | |
| 2011/0032404 A1 | 2/2011 | Kikuchi | |
| 2011/0068253 A1 | 3/2011 | Arishima et al. | 250/208.1 |
| 2011/0080492 A1 | 4/2011 | Matsuda et al. | |
| 2011/0080493 A1 | 4/2011 | Kono et al. | |
| 2011/0084197 A1 * | 4/2011 | Sugawa et al. | 250/208.1 |
| 2011/0085064 A1 | 4/2011 | Nishide | 348/294 |
| 2011/0121404 A1 * | 5/2011 | Shifren et al. | 257/392 |
| 2011/0134270 A1 | 6/2011 | Arishima et al. | |
| 2011/0157441 A1 | 6/2011 | Okita et al. | 348/301 |
| 2011/0163407 A1 * | 7/2011 | Yuzurihara et al. | 257/463 |
| 2011/0168872 A1 | 7/2011 | Kobayashi et al. | 250/208.1 |
| 2011/0169989 A1 | 7/2011 | Kono et al. | |
| 2011/0234868 A1 | 9/2011 | Yamashita et al. | 348/294 |
| 2011/0242300 A1 | 10/2011 | Ogura et al. | 348/300 |
| 2012/0026371 A1 | 2/2012 | Itano et al. | 348/301 |
| 2013/0015535 A1 * | 1/2013 | Yang et al. | 257/408 |

FOREIGN PATENT DOCUMENTS

| | | |
|---|---|---|
| CN | 1764244 A | 4/2006 |
| CN | 101043046 A | 9/2007 |

(56) References Cited

FOREIGN PATENT DOCUMENTS

| | | |
|---|---|---|
| CN | 101197386 A | 6/2008 |
| CN | 101395718 A | 3/2009 |
| CN | 101685188 A | 3/2010 |
| EP | 1930950 A2 | 11/2008 |
| JP | 01-295458 A | 11/1989 |
| JP | 03-256359 A | 11/1991 |
| JP | H04-206773 A | 7/1992 |
| JP | H06-45577 A | 2/1994 |
| JP | 07-058308 A | 3/1995 |
| JP | H11-284168 A | 10/1999 |
| JP | 2000-311997 A | 11/2000 |
| JP | 2000-312024 A | 11/2000 |
| JP | 2002-026302 A | 1/2002 |
| JP | 2002-044522 A | 2/2002 |
| JP | 2002-051262 A | 2/2002 |
| JP | 2002-090462 A | 3/2002 |
| JP | 2002-199292 A | 7/2002 |
| JP | 2002-344809 A | 11/2002 |
| JP | 2003-218332 A | 7/2003 |
| JP | 2003-318381 A | 11/2003 |
| JP | 2003-329777 A | 11/2003 |
| JP | 2005-228956 A | 8/2005 |
| JP | 2005-317581 A | 11/2005 |
| JP | 2006-147709 A | 6/2006 |
| JP | 2006-262358 A | 9/2006 |
| JP | 2006-310933 A | 11/2006 |
| JP | 2007-081083 A | 3/2007 |
| JP | 2007-300521 A | 11/2007 |
| JP | 2008-177191 A | 7/2008 |
| JP | 2008-543085 A | 11/2008 |
| JP | 2009-252782 A | 10/2009 |
| KR | 10-2008-003381 A | 4/2008 |
| WO | 00/26966 A1 | 5/2000 |
| WO | 2009/146253 A1 | 12/2009 |

* cited by examiner

F I G. 4A
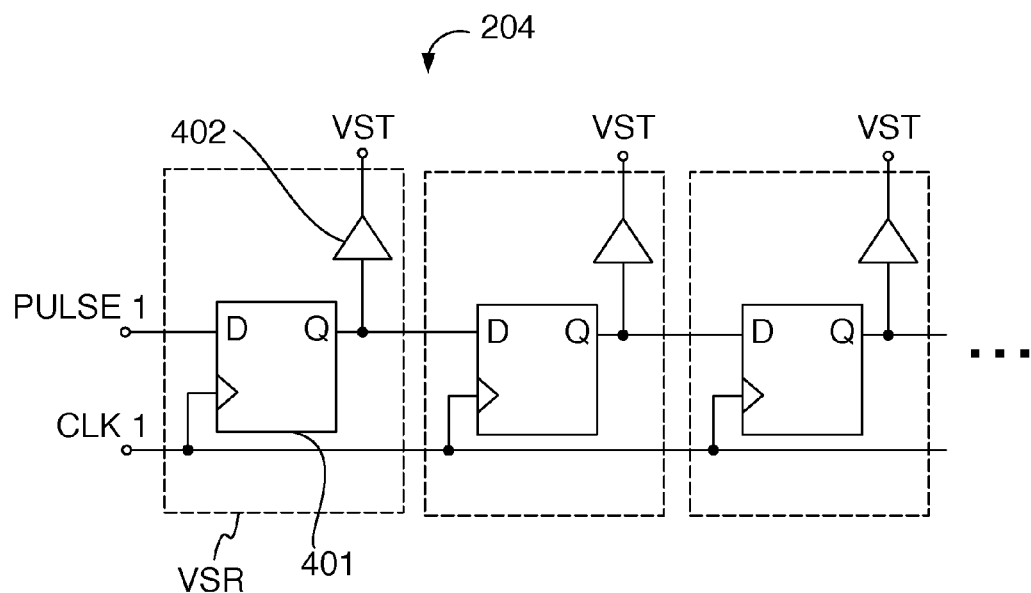
F I G. 4B
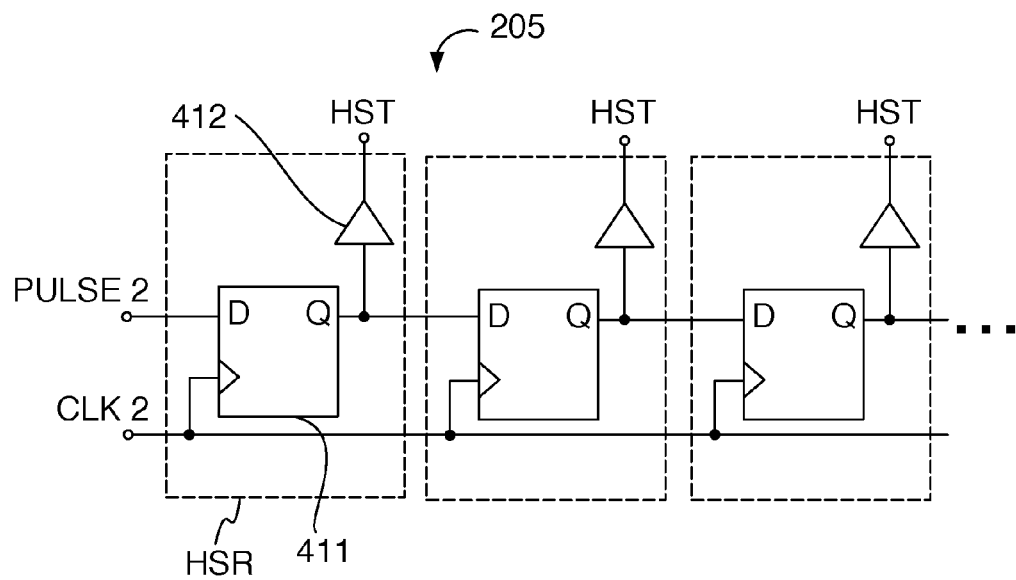

SOLID-STATE IMAGING APPARATUS HAVING PIXELS WITH PLURAL SEMICONDUCTOR REGIONS

BACKGROUND OF THE INVENTION

1. Field of the Invention

The present invention relates to a solid-state imaging apparatus and an imaging system.

2. Description of the Related Art

Japanese Patent Laid-Open No. 2003-318381 discloses a solid-state imaging apparatus in which a well region where an AF sensor region having an AF sensor photodiode is arranged and a well region where an AE sensor region having an AE sensor photodiode is arranged are electrically isolated from each other. An analog circuit region is arranged between the AF sensor region and the AE sensor region. The analog circuit region is arranged in a well region of a conductivity type different from that of the well regions of the AF sensor region and the AE sensor region.

Japanese Patent Laid-Open No. 2003-318381 neither discloses nor suggests arranging a photodiode and a circuit for processing the signal output from the photodiode in separate wells in individual pixels of a pixel array.

Conventionally, a photoelectric converter and an in-pixel readout circuit that outputs a signal corresponding to charges generated in the photoelectric converter to a column signal line are arranged in one well in individual pixels of a pixel array. In this arrangement, charges can move between the photoelectric converter and the in-pixel readout circuit via the well in the individual pixels. This can lead to poorer image quality.

SUMMARY OF THE INVENTION

The present invention provides a technique advantageous in improving image quality.

One of the features of the present invention provides a solid-state imaging apparatus having a pixel array in which a plurality of pixels are arranged to form a plurality of rows and a plurality of columns, and a plurality of column signal lines are arranged, each of the plurality of pixels comprises: a photoelectric converter including a first well formed in a semiconductor substrate and having a first conductivity type, and an impurity region arranged in the first well and having a second conductivity type different from the first conductivity type; and an in-pixel readout circuit which outputs, to the column signal line, a signal corresponding to charges generated in the photoelectric converter, the in-pixel readout circuit including a circuit element arranged in a second well having the first conductivity type, wherein the first well and the second well are isolated by a semiconductor region having the second conductivity type.

Further features of the present invention will become apparent from the following description of exemplary embodiments with reference to the attached drawings.

BRIEF DESCRIPTION OF THE DRAWINGS

FIGS. 4A and 4B explain an example of the arrangements of shift registers according to the embodiment of the present invention;

DESCRIPTION OF THE EMBODIMENTS

Figure 1A:
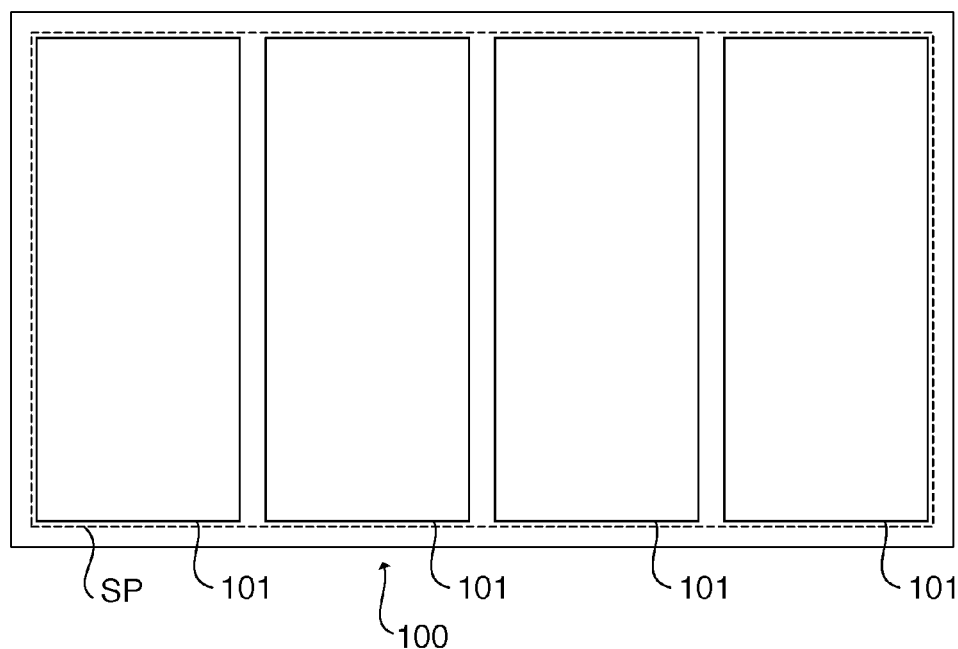
FIGS. 1A and 1B explain an example of the schematic arrangement of a solid-state imaging apparatus according to an embodiment of the present invention.
Figure 1B:
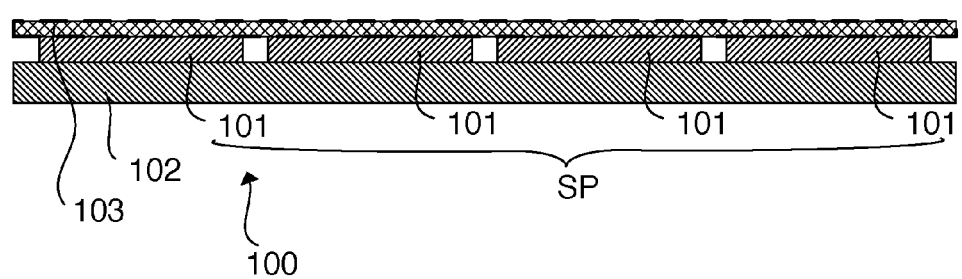

The schematic arrangement of a solid-state imaging apparatus 100 according to an embodiment of the present invention will be described with reference to FIGS. 1A and 1B. The solid-state imaging apparatus 100 can be formed by, for example, arraying a plurality of imaging blocks 101. In this case, an array of a plurality of imaging blocks 101 can form a sensor panel SP having one imaging region. The plurality of imaging blocks 101 can be arranged on a support substrate 102. When the solid-state imaging apparatus 100 uses a single imaging block 101, the single imaging block 101 forms the sensor panel SP. Each of the plurality of imaging blocks 101 may be provided by, for example, forming a circuit element on a semiconductor substrate or forming a semiconductor layer on, for example, a glass substrate and forming a circuit element on the semiconductor layer. Each of the plurality of imaging blocks 101 has a pixel array in which a plurality of pixels are arrayed so as to form pluralities of rows and columns.

The solid-state imaging apparatus 100 may serve as an apparatus which captures an image of radiation such as X-rays or an apparatus which captures an image of visible light. When the solid-state imaging apparatus 100 serves as an apparatus which captures an image of radiation, a scintillator 103 which converts radiation into visible light can typically be provided on the sensor panel SP. The scintillator 103 converts radiation into visible light, which strikes the sensor panel SP and is photoelectrically converted by each photoelectric converter on the sensor panel SP (imaging block 101).

Figure 2:
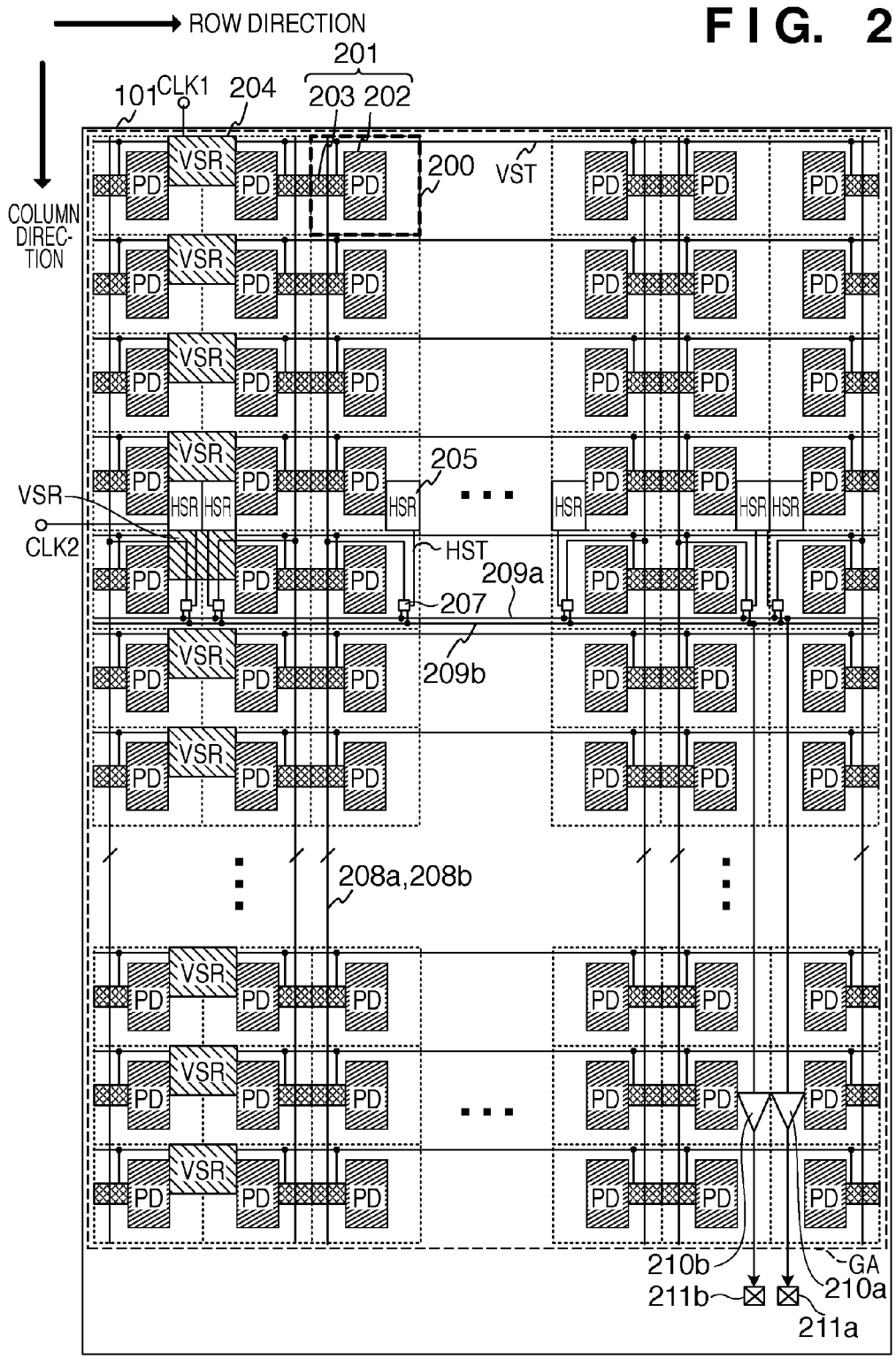
FIG. 2 explains an example of the arrangement of an imaging block according to the embodiment of the present invention.

An example of the arrangement of each imaging block 101 will be described next with reference to FIG. 2. When the solid-state imaging apparatus 100 uses a single imaging block 101, the single imaging block 101 can be regarded as a solid-state imaging apparatus. The imaging block 101 has a pixel array GA in which a plurality of pixels 201 are arrayed so as to form pluralities of rows and columns and a plurality of column signal lines 208a are arranged. Each of the plurality of pixels 201 includes a photoelectric converter (for example, a photodiode) 202, and an in-pixel readout circuit 203 which outputs a signal (light signal) corresponding to a charge generated by the photoelectric converter 202 to the column signal line 208a. In the pixel array GA, a plurality of column signal lines 208b may further be arranged, and the in-pixel readout circuit 203 can be configured to output noise generated by itself to the column signal line 208b in this case. In-pixel readout circuits 203 of two adjacent pixels 201 aligned in the row direction can be axisymmetrically arranged to have, for example, the boundary line between the two pixels 201 as their symmetry axis.

The imaging block 101 includes vertical scanning circuits 204 and horizontal scanning circuits 205. Although the vertical scanning circuit 204 can be placed, for example, between the photoelectric converters 202 on two adjacent columns, it may be placed outside the photoelectric converter 202 on the outermost column in the pixel array GA. The vertical scanning circuit 204 includes, for example, a vertical shift register which performs a shift operation in accordance with a first clock CLK1, and scans a plurality of rows in the pixel array GA in accordance with the shift operation by the vertical shift register. The vertical shift register is formed by connecting a plurality of registers in series, and a pulse received by a register in the first stage is sequentially transferred to registers in subsequent stages in accordance with the first clock CLK1. A row corresponding to a register which holds a pulse is to be selected.

Although the horizontal scanning circuit 205 can be placed, for example, between the photoelectric converters 202 on two adjacent rows, it may be placed outside the photoelectric converter 202 on the outermost row in the pixel array GA. The horizontal scanning circuit 205 includes, for example, a horizontal shift register which performs a shift operation in accordance with a second clock CLK2, and scans a plurality of columns in the pixel array GA in accordance with the shift operation by the horizontal shift register. The horizontal shift register is formed by connecting a plurality of registers in series, and a pulse received by a register in the first stage is sequentially transferred to registers in subsequent stages in accordance with the second clock CLK2. A column corresponding to a register which holds a pulse is to be selected.

The vertical scanning circuit 204 can be formed by vertically arraying a plurality of unit vertical scanning circuits VSR each including one register that constitutes the vertical shift register. Each unit vertical scanning circuit VSR can be placed in the region sandwiched by a photoelectric converter 202 of a pixel belonging to a given column (the leftmost column (that is, the first column) in FIG. 2) and a photoelectric converter 202 of a pixel belonging to a column adjacent to the given column (the second column from the left (that is, the second column) in FIG. 2). When a pulse is transferred via the vertical shift register, each unit vertical scanning circuit VSR drives a row select signal VST to active level so that pixels 201 on a row to which it belongs are selected. A light signal and noise from the pixel 201 on the selected row are output to the column signal lines 208a and 208b, respectively. Referring to FIG. 2, the column signal lines 208a and 208b are indicated by a single line. Pulse signals (start pulses) PULSE1 and PULSE2 are supplied to the input terminals (not shown) of the vertical scanning circuit 204 and horizontal scanning circuit 205, respectively.

The horizontal scanning circuit 205 can be formed by horizontally arraying a plurality of unit horizontal scanning circuits HSR each including one register that constitutes the horizontal shift register. Each unit horizontal scanning circuit HSR is placed in the region sandwiched by two photoelectric converters 202 in each pair of two adjacent pixels (a pair of pixels on the first and second columns, a pair of pixels on the third and fourth columns, . . . ) belonging to one row (the fourth row from the top (that is, the fourth row) in FIG. 2). However, each unit horizontal scanning circuit HSR is not placed in the region sandwiched by two photoelectric converters 202 in two adjacent pixels aligned in the column direction. This arrangement is advantageous to reduce the gap between the photoelectric converters 202 in the column direction. When a pulse is transferred via the horizontal shift register, each unit horizontal scanning circuit HSR controls a switch 207 so that a column to which it belongs is selected, that is, the column signal lines 208a and 208b on this column are connected to horizontal signal lines 209a and 209b, respectively. That is, a light signal and noise from the pixel 201 on the selected row are output to the column signal lines 208a and 208b, respectively, and signals from the selected column (that is, the selected column signal lines 208a and 208b) are output to the horizontal signal lines 209a and 209b. This implements X-Y addressing. The horizontal signal lines 209a and 209b are connected to the inputs of output amplifiers 210a and 210b, respectively, and signals output to the horizontal signal lines 209a and 209b are amplified by the output amplifiers 210a and 210b, respectively, and output via pads 211a and 211b, respectively.

The pixel array GA can be regarded as being obtained by arraying a plurality of unit cells 200 each including the pixel 201 so as to form pluralities of rows and columns. The unit cells 200 can include several types. A certain unit cell 200 includes at least part of the unit vertical scanning circuit VSR. Although a set of two unit cells 200 includes only one unit vertical scanning circuit VSR in the example shown in FIG. 2, one unit cell 200 may include one unit vertical scanning circuit VSR or a set of three or more unit cells 200 may include one unit vertical scanning circuit VSR. Another unit cell 200 includes at least part of the unit horizontal scanning circuit HSR. Although one unit cell 200 includes one unit horizontal scanning circuit HSR in the example shown in FIG. 2, a set of a plurality of unit cells 200 may include one unit vertical scanning circuit VSR. Still another unit cell 200 includes both at least part of the unit vertical scanning circuit VSR and at least part of the unit horizontal scanning circuit HSR. Still another unit cell 200 includes, for example, a unit cell including at least part of the output amplifier 210a, a unit cell including at least part of the output amplifier 210b, and a unit cell including the switch 207.

An example of the arrangement of each pixel 201 will be described with reference to FIG. 3. The pixel 201 includes the photoelectric converter 202 and in-pixel readout circuit 203, as described earlier. The photoelectric converter 202 can typically be a photodiode. The in-pixel readout circuit 203 can include, for example, a first amplifier circuit 310, a clamp circuit 320, a light signal sample-and-hold circuit 340, and a noise sample-and-hold circuit 360, and NMOS transistors 343 and 363 and row select switches 344 and 364 in a second amplifier circuit.

The photoelectric converter 202 includes a charge storage unit, which is connected to the gate of a PMOS transistor 303 of the first amplifier circuit 310. The source of the PMOS transistor 303 is connected to a current source 305 via a PMOS transistor 304. A first source follower circuit is formed using the PMOS transistor 303 and current source 305. Forming a source follower circuit using the PMOS transistor 303 is effective in reducing 1/f noise. The PMOS transistor 304 serves as an enable switch which enables the first source follower circuit upon being turned on when an enable signal EN supplied to its gate changes to active level. The first amplifier circuit 310 outputs a signal corresponding to the potential of a charge-voltage converter CVC to an intermediate node n1.

Figure 3:
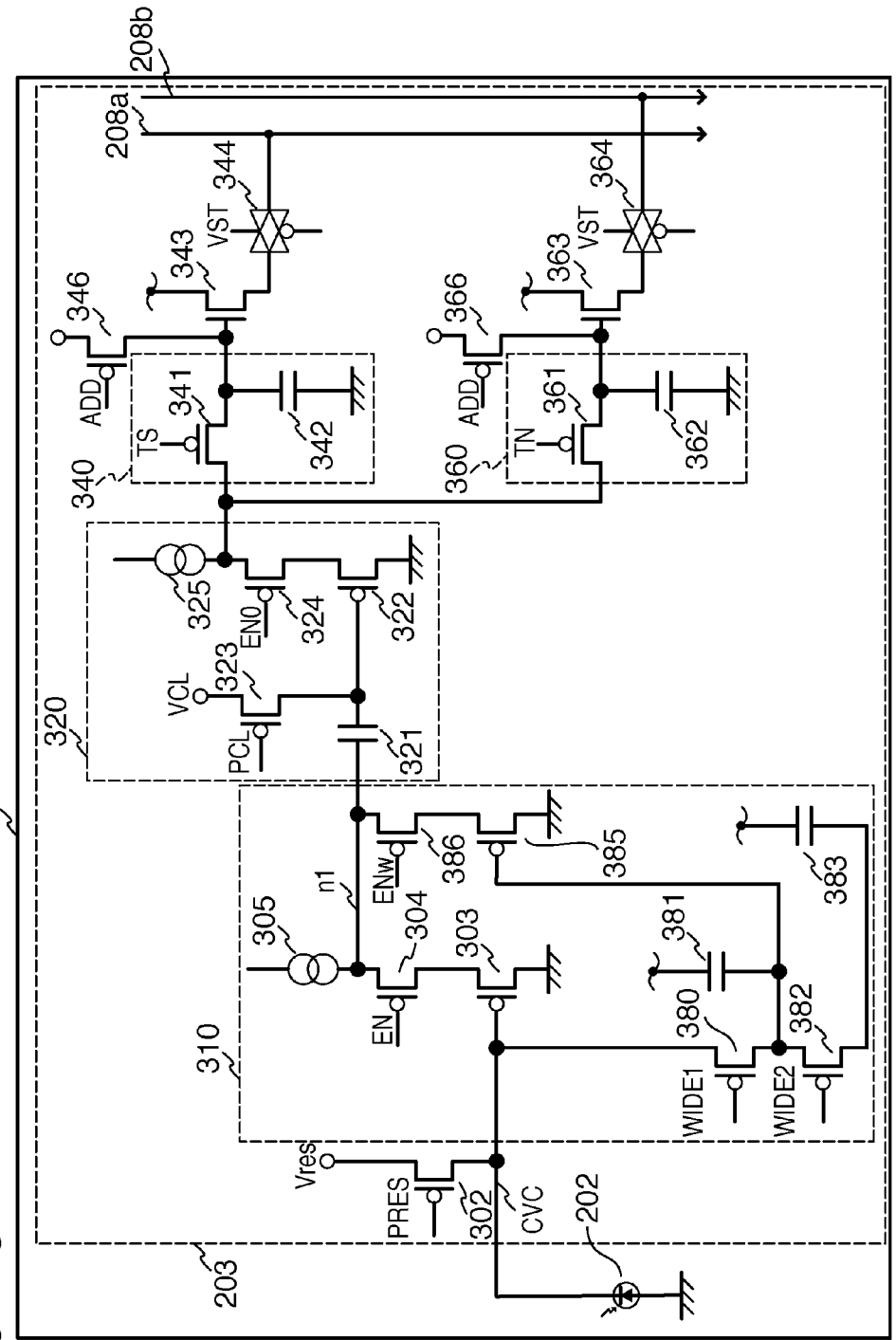
FIG. 3 explains an example of the arrangement of a pixel according to the embodiment of the present invention.

In the example shown in FIG. 3, the charge storage unit of the photoelectric converter 202 and the gate of the PMOS transistor 303 form a common node, which functions as the charge-voltage converter CVC which changes a charge stored in the charge storage unit to a voltage. That is, the charge-voltage converter CVC has the voltage V (=Q/C) determined by the charge Q stored in the charge storage unit and the capacitance value C of the charge-voltage converter CVC. The charge-voltage converter CVC is connected to a reset potential $V_{res}$ via a PMOS transistor 302 serving as a reset switch. When a reset signal PRES changes to active level, the PMOS transistor 302 is turned on, so the potential of the charge-voltage converter CVC is reset to the reset potential $V_{res}$.

The clamp circuit 320 uses a clamp capacitance 321 to clamp noise output to the intermediate node n1 by the first amplifier circuit 310 in accordance with the reset potential of the charge-voltage converter CVC. In other words, the clamp circuit 320 is a circuit for canceling that noise from a signal output from the first source follower circuit to the intermediate node n1 in accordance with the charge generated by the photoelectric converter 202. The noise output to the intermediate node n1 contains kTC noise produced upon resetting. Clamping is done by changing a clamp signal PCL to active level to turn on a PMOS transistor 323, and thereupon changing the clamp signal PCL to inactive level to turn off the PMOS transistor 323. The output terminal of the clamp capacitance 321 is connected to the gate of a PMOS transistor 322. The source of the PMOS transistor 322 is connected to a current source 325 via a PMOS transistor 324. A second source follower circuit is formed using the PMOS transistor 322 and current source 325. The PMOS transistor 324 serves as an enable switch which enables the second source follower circuit upon being turned on when an enable signal EN0 supplied to its gate changes to active level.

A signal output from the second source follower circuit in accordance with the charge generated by photoelectric conversion by the photoelectric converter 202 is written in a capacitance 342 as a light signal via a switch 341 when a light signal sampling signal TS changes to active level. A signal output from the second source follower circuit upon turning on the PMOS transistor 323 immediately after the potential of the charge-voltage converter CVC is reset is noise. This noise is written in a capacitance 362 via a switch 361 when a noise sampling signal TN changes to active level. This noise contains the offset component of the second source follower circuit.

When the unit vertical scanning circuit VSR of the vertical scanning circuit 204 drives the row select signal VST to active level, a signal (light signal) held in the capacitance 342 is output to the column signal line 208a via the NMOS transistor 343 and row select switch 344 in the second amplifier circuit. At the same time, a signal (noise) held in the capacitance 362 is output to the column signal line 208b via the NMOS transistor 363 and row select switch 364 in the second amplifier circuit. The NMOS transistor 343 in the second amplifier circuit and a constant current source (not shown) provided on the column signal line 208a form a source follower circuit. Similarly, the NMOS transistor 363 in the second amplifier circuit and a constant current source (not shown) provided on the column signal line 208b form a source follower circuit.

The pixel 201 may include an add switch 346 which adds light signals from a plurality of adjacent pixels 201. In an add mode, an add mode signal ADD changes to active level, so the add switch 346 is turned on. Thus, the add switch 346 connects the capacitances 342 of adjacent pixels 201 to each other, thereby averaging the light signals. Similarly, the pixel 201 may include an add switch 366 which adds noise signals from a plurality of adjacent pixels 201. When the add switch 366 is turned on, the add switch 366 connects the capacitances 362 of adjacent pixels 201 to each other, thereby averaging the noise signals.

The pixel 201 may have a function for changing the sensitivity. The pixel 201 can include, for example, a first sensitivity change switch 380, a second sensitivity change switch 382, and a circuit element associated with them. When a first change signal WIDE1 changes to active level, the first sensitivity change switch 380 is turned on, so the capacitance value of a first additional capacitance 381 is added to that of the charge-voltage converter CVC. This lowers the sensitivity of the pixel 201. When a second change signal WIDE2 changes to active level, the second sensitivity change switch 382 is turned on, so the capacitance value of a second additional capacitance 383 is added to that of the charge-voltage converter CVC. This further lowers the sensitivity of the pixel 201.

In this manner, adding a function of lowering the sensitivity of the pixel 201 makes it possible to receive a larger amount of light, thus widening the dynamic range. When the first change signal WIDE1 changes to active level, an enable signal $EN_w$ may be changed to active level to enable a PMOS transistor 385 to perform a source follower operation, in addition to enabling the PMOS transistor 303 to perform a source follower operation.

Although the vertical scanning circuit 204 can have various arrangements, it can have an arrangement shown in, for example, FIG. 4A. In the vertical scanning circuit 204 shown in FIG. 4A, each unit vertical scanning circuit VSR includes one D-type flip-flop 401, and the first clock CLK1 is supplied to the clock input of the D-type flip-flop 401. The first pulse signal PULSE1 is supplied to the D input of the D-type flip-flop 401 of the unit vertical scanning circuit VSR in the first stage, and received in response to the first clock CLK1. The D-type flip-flop 401 in the first stage outputs a pulse signal having a duration corresponding to one cycle of the first clock CLK1 from its Q output. The Q output of the D-type flip-flop 401 of each unit vertical scanning circuit VSR is used to select a row to which the unit vertical scanning circuit VSR belongs, and is output as a row select signal VST via, for example, a buffer 402. The Q output of the D-type flip-flop 401 of each unit vertical scanning circuit VSR is connected to the D input of the D-type flip-flop 401 of the unit vertical scanning circuit VSR in the next stage.

Although the horizontal scanning circuit 205 can have various arrangements, it can have an arrangement shown in, for example, FIG. 4B. In the horizontal scanning circuit 205 shown in FIG. 4B, each unit horizontal scanning circuit HSR includes one D-type flip-flop 411, and the second clock CLK2 is supplied to the clock input of the D-type flip-flop 411. The second pulse signal PULSE2 is supplied to the D input of the D-type flip-flop 411 of the unit horizontal scanning circuit HSR in the first stage, and received in response to the second clock CLK2. The unit horizontal scanning circuit HSR in the first stage outputs a pulse signal having a duration corresponding to one cycle of the second clock CLK2 from its Q output. The Q output of each unit horizontal scanning circuit HSR is used to select a column to which the unit horizontal scanning circuit HSR belongs, and is output as a column select signal HST via, for example, a buffer 412. The Q output of each unit horizontal scanning circuit HSR is connected to the D input of the D-type flip-flop 411 of the unit horizontal scanning circuit HSR in the next stage. Note that the vertical scanning period that is the scanning period of the vertical scanning circuit 204 is obtained by multiplying the horizontal scanning period of the horizontal scanning circuit 205 by the number of rows in the pixel array GA. The horizontal scanning period is the period of time required to scan all columns in the pixel array GA. Hence, the frequency of the second clock CLK2 supplied to the horizontal scanning circuit 205 which generates the column select signal HST used to select a column is greatly higher than that of the first clock CLK1 supplied to the vertical scanning circuit 204 which generates the row select signal VST used to select a row.

Figure 5:
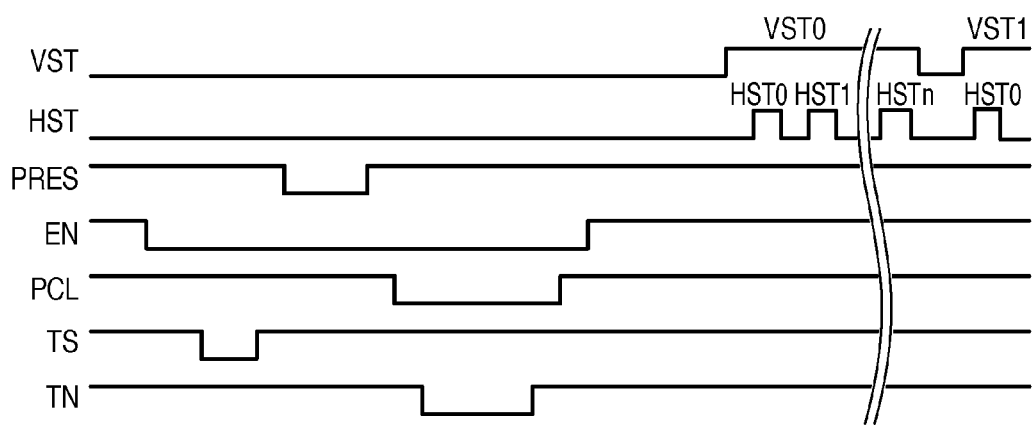
FIG. 5 explains an example of a timing chart according to the embodiment of the present invention.

Main signals supplied to each pixel 201 will be described with reference to FIG. 5. The reset signal PRES, enable signal EN, clamp signal PCL, light signal sampling signal TS, and noise sampling signal TN are low-active signals. Although not shown in FIG. 5, the enable signal EN0 can be a signal similar to the enable signal EN. Also, although not shown in FIG. 5, the enable signal $EN_w$ can make a transition in the same way as in the enable signal EN when the first change signal WIDE1 becomes active.

First, the enable signal EN becomes active on all rows in the pixel array GA, and the light signal sampling signal TS changes to active level in a pulsed pattern, so a light signal is written in the capacitance 342. Next, the reset signal PRES changes to active level in a pulsed pattern, so the potential of the charge-voltage converter CVC is reset. The clamp signal PCL changes to active level in a pulsed pattern. When the clamp signal PCL is at active level, the noise sampling signal TN changes to active level in a pulsed pattern, so noise is written in the capacitance 362.

A unit vertical scanning circuit VSR corresponding to the first row of the vertical scanning circuit 204 changes its row select signal VST (VST0) to active level. This means that the vertical scanning circuit 204 selects the first row of the pixel array GA. In this state, unit horizontal scanning circuits HSR corresponding to the first to last columns of the horizontal scanning circuit 205 change their column select signals HST (HST0-HSTn) to active level. This means that the horizontal scanning circuit 205 sequentially selects the first to last columns of the pixel array GA. Thus, light signals and noise signals of pixels on the first to last columns on the first row of the pixel array GA are output from the output amplifiers 210a and 210b, respectively. After that, a unit vertical scanning circuit VSR corresponding to the second row of the vertical scanning circuit 204 changes its row select signal VST (VST1) to active level. Unit horizontal scanning circuits HSR corresponding to the first to last columns of the horizontal scanning circuit 205 change their column select signals HST (HST0-HSTn) to active level. By performing such an operation for the first to last rows, one image is output from the pixel array GA.

Figure 6:
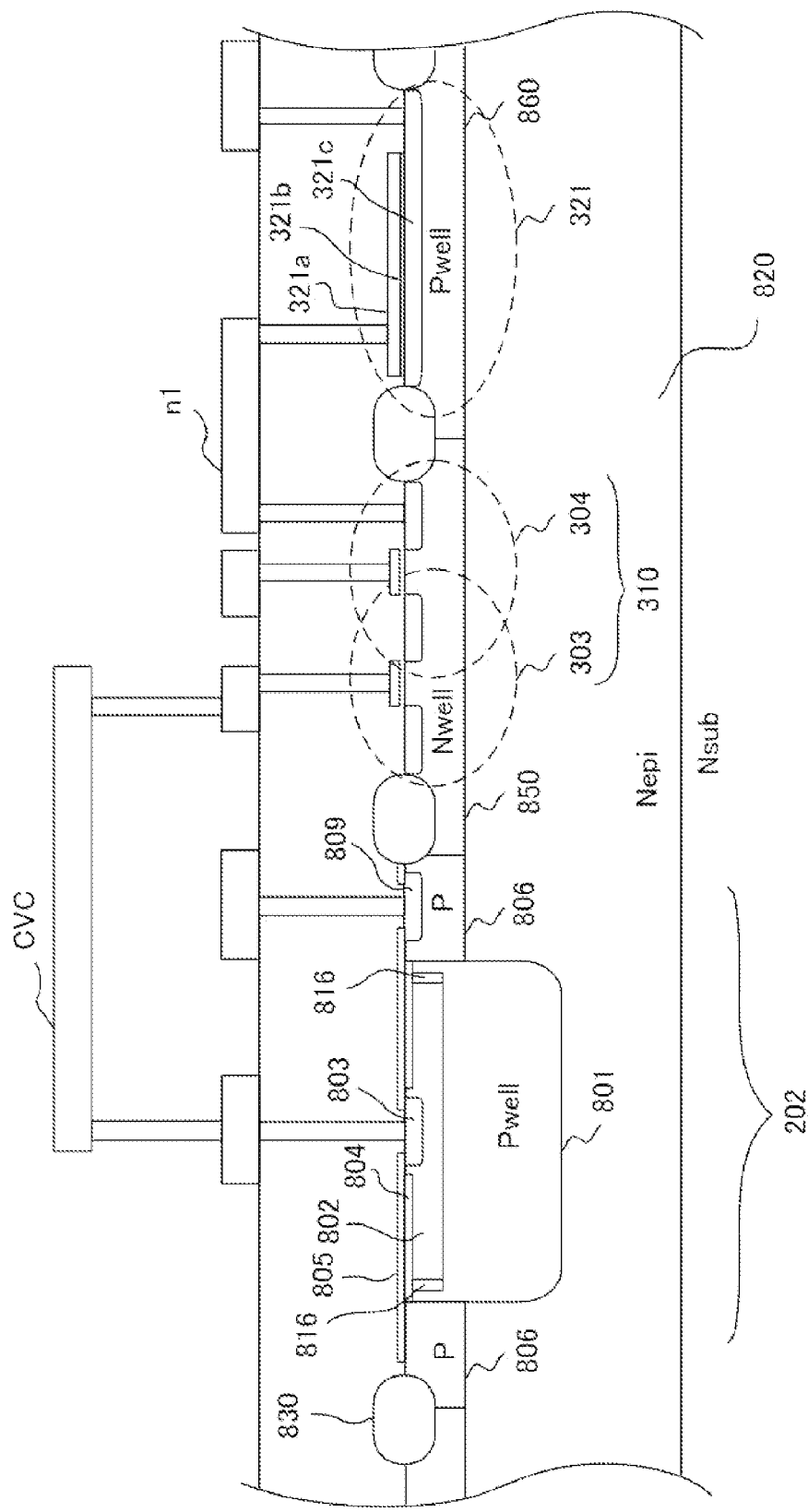
FIG. 6 illustrates examples of the arrangements of a photoelectric converter and an in-pixel readout circuit.

Examples of the arrangements of the photoelectric converter 202 and the in-pixel readout circuit 203 will be described with reference to FIG. 6. This description will be made assuming that the first conductivity type is the p type, and the second conductivity type is the n type. However, the first conductivity type may be the n type, and the second conductivity type may be the p type. An example of the arrangement of the photoelectric converter 202 will be explained first. The imaging block 101 can be formed on a semiconductor substrate made by, for example, epitaxially growing a semiconductor layer 820 of the second conductivity type (n type) on a semiconductor member Nsub of the second conductivity type. The elements of the photoelectric converter 202 and the in-pixel readout circuit 203 are insulated from each other by an element isolation portion 830. The photoelectric converter 202 of each pixel 201 includes, for example, a first well (impurity region) 801 of the first conductivity type formed in the semiconductor layer 820, and impurity regions 802 and 816 of the second conductivity type arranged in the first well 801. The impurity concentration to form the second conductivity type is higher in the impurity region 802 than in the impurity region 816. The impurity region 802 is surrounded by the impurity region 816. An impurity region 803 of the second conductivity type is arranged in the impurity region 802. The impurity concentration to form the second conductivity type is higher in the impurity region 803 than in the impurity region 802. An impurity region 804 of the first conductivity type is arranged on the impurity regions 802 and 816. The first well 801 of the first conductivity type, the impurity region 804 of the first conductivity type, and the impurity regions 802, 816, and 803 of the second conductivity type form a buried photodiode.

The upper peripheral portion (that is, the shallow portion) of the first well 801 of the first conductivity type is surrounded by an impurity region 806 of the first conductivity type. The impurity region 806 includes a contact region 809 of the first conductivity type so that a predetermined potential (for example, ground potential) is provided via the contact connected to the contact region 809. A well 850 of the second conductivity type is arranged around the impurity region 806. Charges (electrons) generated by photoelectrically converting light incident on the photoelectric converter 202 are collected by the impurity region 802 and further collected by the impurity region 803. The impurity region 803 is connected to the first amplifier circuit 310 of the in-pixel readout circuit 203 via the charge-voltage converter CVC. The first amplifier circuit 310 outputs a signal corresponding to the potential of the charge-voltage converter CVC to the intermediate node n1.

A second well 860 of the first conductivity type is also formed in the semiconductor layer 820 of the second conductivity type. A semiconductor region of the second conductivity type (for example, the well 850 of the second conductivity type or the semiconductor layer 820 of the second conductivity type) opposite to the first conductivity type is arranged between the first well 801 of the first conductivity type and the second well 860 of the first conductivity type. The clamp capacitance 321 serving as a circuit element or a capacitive element is arranged in the second well 860 of the first conductivity type.

The clamp capacitance 321 includes a first electrode 321c formed from an impurity region of the second conductivity type formed in the second well 860, an insulating film 321b arranged on the first electrode 321c, and a second electrode 321a arranged on the insulating film 321b. The intermediate node n1 can be connected to, for example, the second electrode 321a. That is, a signal corresponding to charges generated in the photoelectric converter 202 can be supplied to the second electrode 321a of the clamp capacitance 321 serving as a capacitive element. The insulating film 321b can be formed in, for example, the gate oxide film forming process. The second electrode 321a can be formed by polysilicon in, for example, the gate electrode forming process. The capacitive element having such an arrangement is resistant to noise generated by charge movement to another well (for example, the first well) as compared to a capacitive element formed by bonding two impurity layers of different conductivity types.

Consider a comparative example in which a single well is shared as the first well 801 and the second well 860, or the first well 801 and the second well 860 are connected by a semiconductor region of the first conductivity type, unlike the above-described arrangement. In this case, since the charges can easily move between the first well 801 and the second well 860, the charges generated in the photoelectric converter 202 may affect the clamp capacitance 321 that is a circuit element of the in-pixel readout circuit 203. Reversely, the potential change of the first electrode 321c and the second electrode 321a of the clamp capacitance 321 may affect the photoelectric converter 202. The clamp capacitance 321 has been exemplified above. However, the circuit element that can be arranged in the second well 860 may be, for example, an NMOS transistor serving as the second amplifier circuit 343 or 363 or the capacitance 342 or 362.

The maximum depth of the first well 801 is preferably larger than that of the second well 860. This arrangement is excellent because it can improve the sensitivity of the photoelectric converter 202 and reduce charge movement from the second well 860 to the first well 801.

Figure 7:
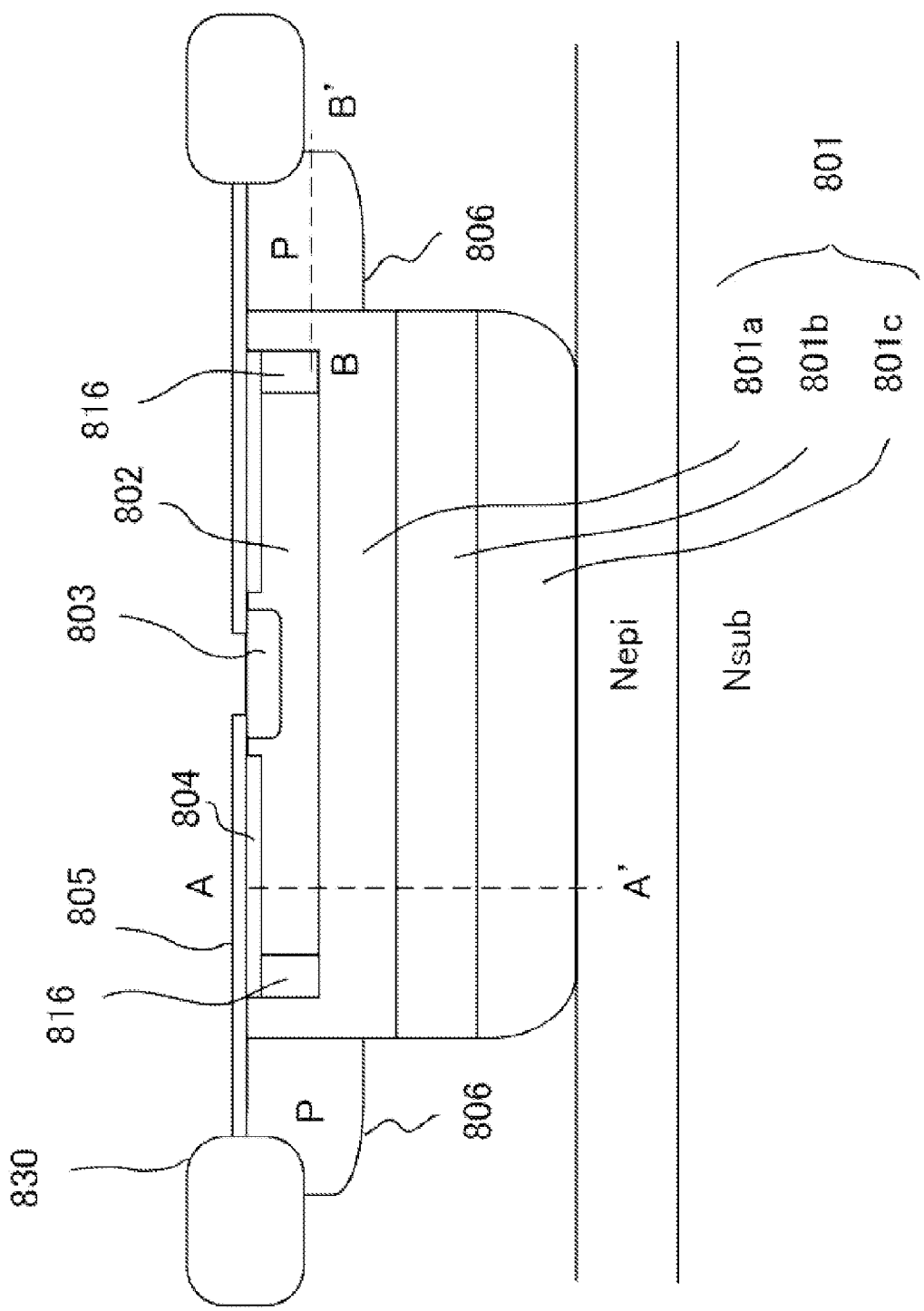
FIG. 7 illustrates an example of the arrangement of the photoelectric converter.
Figure 8:
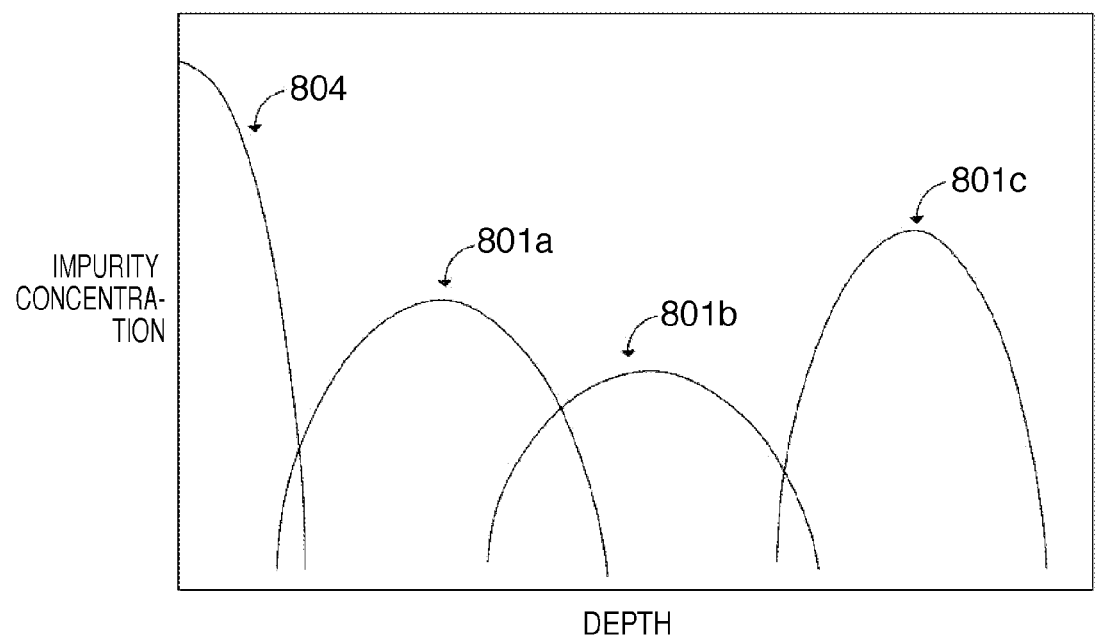
FIG. 8 shows the impurity concentration of the first conductivity type along the line A-A' in FIG. 7.

As illustrated in FIG. 7, the first well 801 preferably includes a stacked structure portion having a structure (multistage well structure) formed by stacking a plurality of semiconductor regions 801a, 801b, and 801c of the first conductivity type. FIG. 8 shows the impurity concentration of the first conductivity type along the line A-A' in FIG. 7. The plurality of semiconductor regions 801a, 801b, and 801c can be distinguished from each other by, for example, the difference in the impurity concentration peak value. FIGS. 7 and 8 show the three-layered first well 801. However, a two-layered first well 801 or a first well 801 having four or more layers may be adopted.

Figure 9:
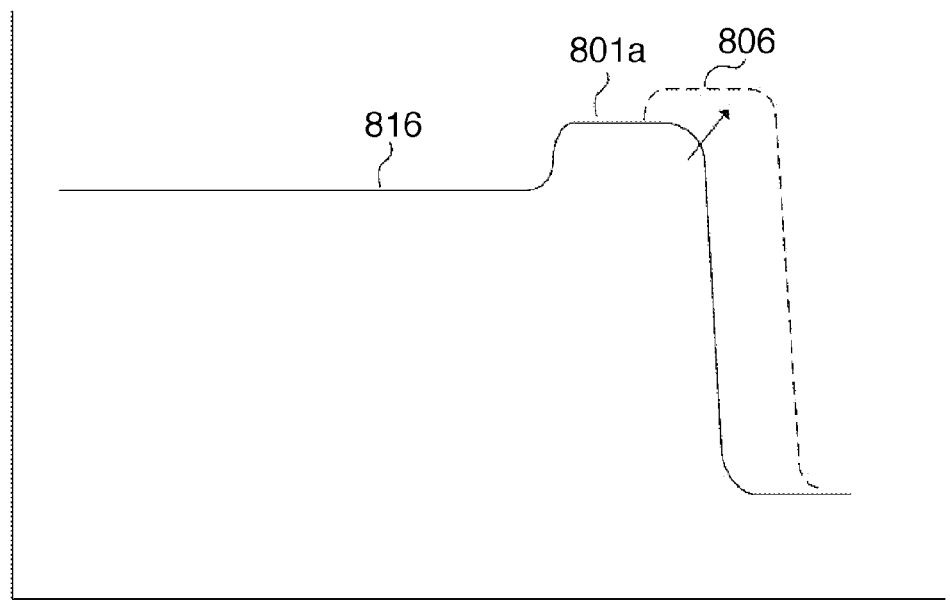
FIG. 9 shows the potential along the line B-B' in FIG. 7.

FIG. 9 shows the potential along the line B-B' in FIG. 7. Surrounding the upper peripheral portion (that is, the shallow portion) of the first well 801 of the first conductivity type by the impurity region 806 of the first conductivity type allows to reduce charge overflow from the photoelectric converter 202. That is, providing the impurity region 806 makes it possible to raise the potential barrier at the peripheral portion of the photoelectric converter 202, as indicated by the dotted line.

Figure 10:
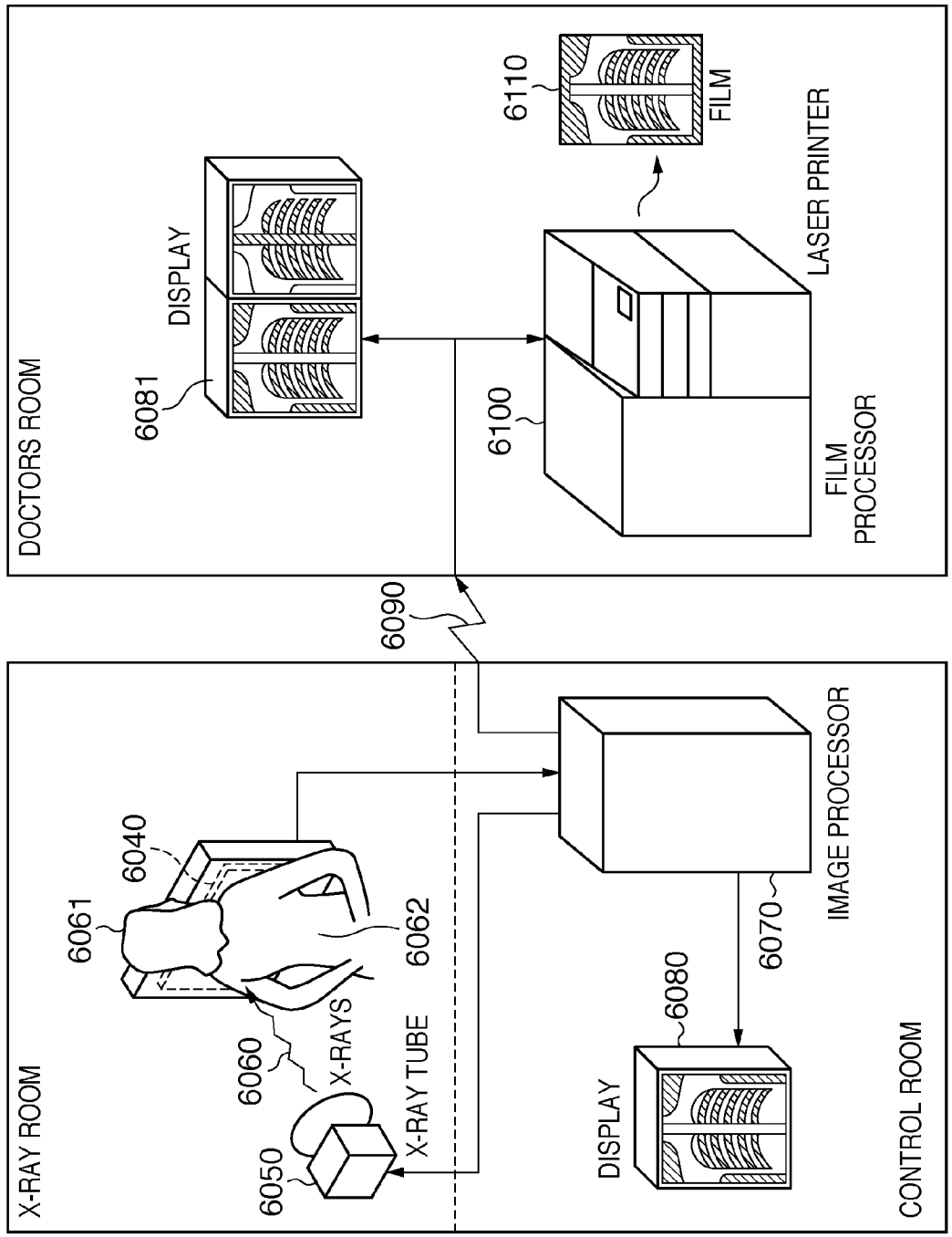
FIG. 10 illustrates a radiation imaging system.

FIG. 10 illustrates an example in which the solid-state imaging apparatus according to the present invention is applied to an X-ray diagnostic system (radiation imaging system). The radiation imaging system includes a radiation imaging apparatus 6040 and an image processor 6070 which processes a signal output from the radiation imaging apparatus 6040. The radiation imaging apparatus 6040 serves as an apparatus to which the solid-state imaging apparatus 100 mentioned above is applied and which captures radiation, as illustrated in FIG. 1B. X-rays 6060 emitted by an X-ray tube (radiation source) 6050 are transmitted through a chest 6062 of a patient or a subject 6061, and enter the radiation imaging apparatus 6040. The incident X-rays bear the information of the interior of the body of the subject 6061. The image processor (processor) 6070 processes a signal (image) output from the radiation imaging apparatus 6040, and can display the image on, for example, a display 6080 in a control room based on the signal obtained by processing.

Also, the image processor 6070 can transfer the signal obtained by processing to a remote site via a transmission path 6090. This makes it possible to display the image on a display 6081 placed in, for example, a doctor room at another site or record the image on a recording medium such as an optical disk. The recording medium may be a film 6110, and a film processor 6100 records the image on the film 6110 in this case.

The solid-state imaging apparatus according to the present invention is also applicable to an imaging system which captures an image of visible light. Such an imaging system can include, for example, the solid-state imaging apparatus 100 and a processor which processes a signal output from the solid-state imaging apparatus 100. The processing by the processor can include at least one of, for example, processing of converting the image format, processing of compressing the image, processing of changing the image size, and processing of changing the image contrast.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-155261, filed Jul. 7, 2010, which is hereby incorporated by reference herein in its entirety.

What is claimed is:

1. A solid-state imaging apparatus having a pixel array in which a plurality of pixels are arranged to form a plurality of rows and a plurality of columns, and a plurality of column signal lines are arranged,
each of the plurality of pixels comprising:
a first semiconductor region having a first conductivity type;
a photoelectric converter including a second semiconductor region arranged in the first semiconductor region and having a second conductivity type that is different from the first conductivity type, and a third semiconductor region arranged in the second semiconductor region and having the first conductivity type;
a charge-voltage converter configured to convert charges stored in the photoelectric converter to a voltage;
a reset transistor configured to reset the charge-voltage converter;
a first amplifier circuit configured to output a signal corresponding to a potential of the charge-voltage converter; and
a clamp capacitance connected to an output node of the first amplifier circuit,
wherein the clamp capacitance is arranged on a fourth semiconductor region that is arranged in the first semiconductor region and having the second conductivity type, and
wherein the second semiconductor region and the fourth semiconductor region are isolated by the first semiconductor region.

2. The apparatus according to claim 1, wherein the clamp capacitance comprises a first electrode formed in the fourth semiconductor region, and a second electrode formed on an insulating film on the first electrode.

3. The apparatus according to claim 2, wherein the first electrode includes a sixth semiconductor region formed in the fourth semiconductor region.

4. The apparatus according to claim 1, wherein a maximum depth of the second semiconductor region is larger than a maximum depth of the fourth semiconductor region.

5. The apparatus according to claim 1, wherein the second semiconductor region comprises a stacked structure portion formed by stacking a plurality of semiconductor regions having the first conductivity type.

6. The apparatus according to claim 5, wherein each of the plurality of pixels further comprises a semiconductor region having the second conductivity type, which is arranged to surround a periphery of the stacked structure portion and which has a maximum depth smaller than a maximum depth of the stacked structure portion.

7. An imaging system comprising:
a solid-state imaging apparatus defined in claim 1; and
a processor which processes a signal output from the solid-state imaging apparatus.

8. The apparatus according to claim 1, wherein each of the plurality of pixels further comprises a fifth semiconductor region arranged between the second semiconductor region and the fourth semiconductor region and having the first conductivity type.

* * * * *